(12) United States Patent
Jäger et al.

(10) Patent No.: US 10,333,488 B2
(45) Date of Patent: Jun. 25, 2019

(54) ELECTROACOUSTIC COMPONENT AND CRYSTAL CUTS FOR ELECTROACOUSTIC COMPONENTS

(71) Applicant: Snaptrack Inc., San Diego, CA (US)

(72) Inventors: Philipp Michael Jäger, München (DE); Ulrike Rösler, Hebertshausen (DE)

(73) Assignee: SnapTrack, Inc., San Diego, CA (US)

( * ) Notice: Subject to any disclaimer, the term of this patent is extended or adjusted under 35 U.S.C. 154(b) by 407 days.

(21) Appl. No.: 15/301,882

(22) PCT Filed: Apr. 13, 2015

(86) PCT No.: PCT/EP2015/057951
§ 371 (c)(1),
(2) Date: Oct. 4, 2016

(87) PCT Pub. No.: WO2015/162025
PCT Pub. Date: Oct. 29, 2015

(65) Prior Publication Data
US 2017/0026025 A1 Jan. 26, 2017

(30) Foreign Application Priority Data
Apr. 25, 2014 (DE) .......... 10 2014 105 860

(51) Int. Cl.
*H03H 9/25* (2006.01)
*H01L 41/187* (2006.01)
*H03H 9/02* (2006.01)

(52) U.S. Cl.
CPC ...... *H03H 9/0296* (2013.01); *H03H 9/02015* (2013.01); *H03H 9/02543* (2013.01)

(58) Field of Classification Search
CPC . H03H 9/0296; H03H 9/0215; H03H 9/02543
(Continued)

(56) References Cited

U.S. PATENT DOCUMENTS 6,946,930 B2 9/2005 Kadota et al.
7,622,851 B2 * 11/2009 Zhang .................... H01L 41/18
310/358
(Continued)

FOREIGN PATENT DOCUMENTS

DE 102011119660 A1 5/2013
EP 1679794 A2 7/2006
(Continued)

OTHER PUBLICATIONS

Jäger, P. et al.: "Properties of Surface Acoustic Waves on NdCOB Single Crystals," Oct. 21, 2010, pp. 1-32.
(Continued)

*Primary Examiner* — Thomas M Dougherty
(74) *Attorney, Agent, or Firm* — Patterson & Sheridan, L.L.P.

(57) ABSTRACT

An electroacoustic component is disclosed. In an embodiment, the electroacoustic component includes a piezoelectric substrate comprising a rare earth metal and calcium oxoborates (RE-COB) and component structures arranged on the substrate, the component structures being suitable for converting between RF signals and acoustic waves, wherein the waves are capable of propagation in a direction x''', and wherein the direction x''' is determined by Euler angles ($\lambda$, $\mu$, $\theta$), the Euler angles being selected from angle ranges (20-90, 95-160, 15-55), (20-85, 95-160, 95-125) and (15-25, 85-100, 0-175).

17 Claims, 3 Drawing Sheets

(58) Field of Classification Search
USPC .................................. 310/313 A, 313 R, 358
See application file for complete search history.

(56) References Cited

U.S. PATENT DOCUMENTS

| | | |
|---|---|---|
| 2003/0137367 A1 | 7/2003 | Kadota |
| 2003/0141947 A1 | 7/2003 | Kadota et al. |
| 2007/0164630 A1* | 7/2007 | Zhang ..................... H01L 41/18 |
| | | 310/311 |
| 2007/0194657 A1 | 8/2007 | Morita et al. |
| 2011/0080225 A1 | 4/2011 | Owaki et al. |
| 2014/0327340 A1* | 11/2014 | Tsurumi ................... G01L 1/16 |
| | | 310/338 |
| 2015/0111765 A1* | 4/2015 | Laury-Kleintop ... G01N 29/022 |
| | | 506/9 |

FOREIGN PATENT DOCUMENTS

| | | |
|---|---|---|
| EP | 1816744 A1 | 8/2007 |
| EP | 2403141 A1 | 1/2012 |
| JP | 2003201200 A | 7/2003 |
| JP | 3804410 B2 | 8/2006 |
| JP | 3835286 B2 | 10/2006 |
| JP | 4300889 B2 | 7/2009 |
| WO | 2007037457 A1 | 4/2007 |

OTHER PUBLICATIONS

Jäger, P. et al.: "Report on the Elastic Constants of NdCOB," Jul. 8, 2011, pp. 1-7.

Karaki, T. et al.: "Evaluation of Material Constants in NdCa4O(BO3)3 Piezoelectric Single Crystal," J. Electroceram., Dec. 2008, pp. 823-826, vol. 21, Issue 1.

Nakao, H. et al.: "Growth and SAW Properties of Rare-Earth Calcium Oxoborate Crystals," J. of Alloys and Compounds, Feb. 2006, pp. 582-585, vols. 408-412.

Nishida, T. et al.: "Theoretical Calculation of the Surface Acoustic Wave Characteristics of GdCOB Single Crystals," Journal of Alloys and Compounds, Elsevier Sequoia, Feb. 9, 2006, pp. 577-581, vols. 408-412.

Nishikawa, T. et al.: "SH-Type Surface Acoustic Waves on Rotated Y-Cut Quartz," Proc. 34th Annual Frequency Control Symposium, May 1980, pp. 286-291.

Shimizu, H. et al.: "Electra-Acoustical Constants and Rayleigh SAW Progagation Characteristics of Rare-Earth Calcium Oxoborate Single Crystals," IEEE Ultrasonics Symposium, Sep. 18-21, 2005, pp. 934-938, vol. 2.

Shimizu, H. et al.: "Evaluation of Material Constants and SAW Properties in LaCa4O(BO3)3 Single Crystals," IEEE Ultrasonics Symposium, Aug. 23-27, 2004, pp. 1218-1222, vol. 2.

Shrout, T.R. et al.: "Elasto-Acoustic Properties of ReCa4O(B03)3 (Re=La, Pr, Nd, Y, Gd) Piezoelectric Crystals," Joint Conference of the IEEE International Frequency Control and the European Frequency and Time Forum (FCS) Proceedings, May 2, 2011, pp. 1-4.

Takeda, H. et al.: "Growth and Piezoelectric Properties of R3Ga5SiO14 and RCa4O(BO3)3 (R: rare-earth elements) Single Crystals," J. of Alloys and Compounds, Feb. 2006 pp. 474-479, vols. 408-412.

Yu, F. et al.: "Characterization of Neodymium Calcium Oxyborate Piezoelectric Crystal With Monoclinic Phase," Crystal Growth & Design, Mar. 8, 2010, pp. 1871-1877, vol. 10.

Zhang, S. et al.: "Gadolinium Calcium Oxyborate Piezoelectric Single Crystals for Ultrahigh Temperature (>1000 [deg.]C) Applications," Journal Applied Physics, American Institute of Physics, Oct. 20, 2008, pp. 84103-1-84103-7, vol. 104, No. 8.

Zhang, S. "Testing of NdCa4O(BO3)3 Single Crystals for Zero TCF Cut Exploration," Pennsylvania State University, Apr. 12, 2011, pp. 1-43.

Zhang, S. et al.: "High Temperature ReCOB Piezocrystals: Recent Developments," Journal of Crystal Growth, Mar. 1, 2011, pp. 884-889, vol. 318, No. 1.

Nishida T., et al., "SAW Properties of the Single Crystals in YCOB System", Ultrasonics Symposium, IEEE, Aug. 7, 2001, vol. 1, pp. 179-183.

International Search Report and Written Opinion—PCT/EP2015/057951—ISA/EPO—dated Jun. 12, 2015.

* cited by examiner

A

A1 (20...90, 95...160, 15...55)
A2 (20...85, 95...160, 95...125) ◀───── A2* (30...64, 98...138, 104...124)
A3 (15...25, 85...100, 0...175)                 $\kappa^2 = 0,8\%$
h/λ: 1%...4%
η = 0,5

B

B1* (50...62, 112...116, 32...40)
$\kappa^2 = 0,4\%$

B1 (15...90, 100...165, 10...50) ◀
B2 (15...90, 100...165, 120...135)
B3 (15...30, 100...110, -10...10)       B1' (66...90, 122...138, 12...50)
B4 (60...75, 135...155, 93...97) ◀      $\kappa^2 = 1\%$
h / λ = 6 % ... 10 %                     $|TCF_2| < 40$ ppb/K^2
η = 0,5

B4* (60...75, 135...155, 95)
h / λ = 6 % ... 10 %
η = 0,5
$|TCF_2| < 40$ ppb/K^2

C

C1 (80...100, 120...170, -10...10)

D

D1 {(15...90, 95...165, 10...55) - (15...60, 95...109, 10...18)
   = (]60...90, 95...165, 10...55)
    +(15...60, ]109...165, 10...55)
    +(15...90, 95...109, ]18...55)}
D2 (15...90, 95...165, 95...135)
D3 (60...75, 135...155, 85...95)
 Al: h / λ = 0,5 % ... 15 %
 Cu: h / λ = 0,2 % ... 8 %

Fig. 1 ically expands at relatively high temperatures, such that the
ELECTROACOUSTIC COMPONENT AND CRYSTAL CUTS FOR ELECTROACOUSTIC COMPONENTS This patent application is a national phase filing under section 371 of PCT/EP2015/057951, filed Apr. 13, 2015, which claims the priority of German patent application 10 2014 105 860.7, filed Apr. 25, 2014, each of which is incorporated herein by reference in its entirety.

TECHNICAL FIELD

The invention relates to electroacoustic components comprising piezoelectric crystals and crystal cuts for electroacoustic components.

BACKGROUND

There are electroacoustic components in which transducer structures convert between RF signals and acoustic waves. Such components generally comprise a piezoelectric material and electrode structures as part of the component structures. Such components can operate with surface acoustic waves (SAWs) or with guided bulk acoustic waves (GBAWs). Such components comprise a piezoelectric substrate, which can generally be present as a crystal.

Such components can be used in RF filters, e.g. in front-end circuits of mobile communication devices. If for example a bandpass filter operates with acoustic waves, then very steep bandpass edges in conjunction with small component dimensions are made possible. This is necessary on account of the close juxtaposition of different frequency bands.

What is problematic is that the position of the center frequencies and the positions of the filter edges may be dependent on temperature. The piezoelectric material generally expands at relatively high temperatures, such that the half wavelength $\Lambda/2$ defined by the finger spacing increases as the temperature rises. As a result, characteristic frequencies shift toward lower frequencies. A further general problem of electroacoustic components comprising a piezoelectric material is the value of the electroacoustic coupling coefficient $\kappa^2$ (more precisely: the value of the magnitude $|\kappa^2|$). In general, the highest possible values for $\kappa^2$ are desired.

In addition to the temperature-induced linear expansion, the stiffness values, i.e. the entries of the stiffness tensor $c_{ijkl}$, may also change and thus lead to a further temperature dependence of the electrical properties.

One typical piezoelectric material for electroacoustic components is quartz, in which Rayleigh waves are capable of propagation. The electroacoustic coupling coefficient $\kappa^2$ may be up to 0.132% in this case.

Electroacoustic components based on quartz as piezoelectric material are known e.g. from the documents EP 01679794 A2, WO 2007/037457 A1, U.S. 2007/194657, EP 01816744 A1, U.S. Pat. No. 6,946,930 B2 or from the document EP 2403141 A1.

A further typical piezoelectric material for electroacoustic components is lithium tantalate. Components based on lithium tantalate are known for example from the document U.S. 2003/0141947 A1 or the document U.S. 2003/0137367 A1.

However, a perfect piezoelectric material having a high electroacoustic coupling coefficient $\kappa^2$ and a vanishing temperature dependence of the electrical properties is still not known.

SUMMARY OF THE INVENTION

Embodiments provide new options for electroacoustic components and, in particular, suitable materials, cut angles and electrode dimensions coordinated therewith.

In one embodiment, an electroacoustic component comprises a piezoelectric substrate comprising or composed of RE-COB. In this case, RE stands for a rare earth metal. In this case, COB stands for calcium oxoborates. Component structures are arranged on the substrate. The component structures are suitable for conversion between RF signals and acoustic waves, and vice versa. In this case, the acoustic waves are capable of propagation in a direction X'''. In this case, the direction X''' is determined by Euler angles ($\lambda$, $\mu$, $\theta$). Said Euler angles ($\lambda$, $\mu$, $\theta$) are selected from the angle ranges (20-90, 95-160, 15-55),
(20-85, 95-160, 95-125),
(15-25, 85-100, 0-175).

In this case, each angle range comprises an angle interval for the first Euler angle $\lambda$, an angle interval for the second Euler angle $\mu$ and an angle interval for the third Euler angle $\theta$.

In this case, the Euler angles ($\lambda$, $\mu$, $\theta$) are defined as follows: firstly, a set of axes x, y, z that are the crystallographic axes of the substrate is taken as a basis.

The first angle, $\lambda$, specifies by what magnitude the x-axis and the y-axis are rotated about the z-axis, wherein the x-axis is rotated in the direction of the y-axis. A new set of axes x', y', z' correspondingly arises, wherein z=z'.

In a further rotation, the z'-axis and y'-axis are rotated about the x'-axis by the angle $\mu$. In this case, the y'-axis is rotated in the direction of the z'-axis. A new set of axes x", y", z" correspondingly arises, wherein x'=x".

In a third rotation, the x"-axis and the y"-axis are rotated about the z"-axis by the angle $\theta$. In this case, the x"-axis is rotated in the direction of the y"-axis. A third set of axes x''', y''', z''' thus arises, wherein z'''=z".

In this case, the x'''-axis and the y'''-axis lie parallel to the surface of the substrate. The z'''-axis is the surface normal of the substrate. The x'''-axis specifies the direction of propagation of the acoustic waves.

The definition is in accordance with the international standard IEC 62276, 2005-05, Annex A1.

FIG. 3 illustrates the corresponding directions of the original, i.e. crystallographic, and rotated axes and also the direction of rotation and the rotation sense. This thereby clearly defines how a piezoelectric crystal must be cut and along which direction the acoustic wave must pass in order that the direction of propagation X''' is obtained.

Determining suitable cut angles and suitable directions of propagation is made more difficult by the fact that the wave modes of the acoustic waves are dependent on a multiplicity of physical parameters, such as e.g. the speed of sound for acoustic waves in the medium, the mass covering by the component structures, the wavelength, etc. These parameters that directly influence the propagation of the acoustic waves are in turn dependent on further material properties, such as e.g. the density of the piezoelectric material, the density of the component structures, the geometrical shape of the component structures, the direction of propagation (especially since there is a virtually infinite selection possibility for the Euler angles themselves) and the frequency of the electrical signals. These multiple mutual dependencies also prevent knowledge of one electroacoustic component from being applied to further electroacoustic components, even if only one parameter in each case is varied. Consequently, the development of electroacoustic properties requires not only highly developed simulation tools but also a profound intrinsic understanding of the physical processes of wave and signal propagation.

In particular, horizontal shear waves (referred to as: SH-mode) may be appropriate here as acoustic waves.

In this case, the Euler angles mentioned above represent a set of possible cut angles or directions of propagation in which the height of the component structures or electrode fingers normalized to the wavelength of the acoustic wave capable of propagation may be between 1 and 4%: $1\% \leq h/\Lambda \leq 4\%$. In this case, the metallization ratio may be between 0.3 and 0.8 and in particular between 0.4 and 0.6. A metallization ratio of 0.5 is possible, in particular. In this case, the metallization ratio $\eta$ is defined by the ratio of width b of the electrode fingers and half the acoustic wavelength $\Lambda/2 : \eta = b/(\Lambda/2)$.

The abovementioned possible set of Euler angles is furthermore distinguished by the fact that it enables a parabolic temperature response of characteristic frequency properties. The temperature dependence of frequency (TCF=temperature coefficient of frequency) can generally be approximated by a Taylor series:

$$F(T) = F_o[1 + TCF_1(T - T_o) + TCF_2(T - T_o)^2 + \ldots]$$

In this case, $F_o$ denotes the frequency at the reference temperature $T_o$. The parameter $TCF_1$, the linear coefficient, here has the dimension of an inverse temperature, the parameter $TCF_2$ here has the dimension of a quadratic inverse temperature $[1/K^2]$, etc.

A parabolic temperature response is particularly advantageous because the linear coefficient $TCF_1$ vanishes. In this case, the parabola vertex is used as the reference temperature and designated as TOT (turn over temperature). It is particularly advantageous if said reference temperature TOT is at the operating temperature of the component. Terms higher than the quadratic terms can generally be disregarded.

In this case, the material of the electroacoustic component or of electroacoustic components described later can comprise or consist of Nd-COB. Overall, a piezoelectric substrate can therefore comprise the stoichiometric composition $RECa_4O(BO_3)_3$. In this case, neodymium, Nd, may be appropriate as rare earth metal.

Rayleigh waves, (SH-wave) polarized shear waves or longitudinal surface waves may be appropriate as acoustic waves. Waves having mixed polarization are also possible, especially at angles that deviate from the crystal axes.

In one embodiment of the electroacoustic component, the abovementioned set of Euler angles can be restricted to the more narrowly defined Euler angles (30-64, 98-138, 104-124). Electroacoustic coupling coefficients $\kappa^2$ of 0.8% and a $TCF_2 \leq 10$ ppb/$K^2$ can be obtained with such Euler angles.

In an alternative embodiment, the direction is determined by Euler angles selected from the angle ranges
(15-90, 100-165, 10-50),
(15-90, 100-165, 120-135),
(15-30, 100-110, −10-10),
(60-75, 135-155, 93-97).

A $TCF_2 \leq 40$ ppb/$K^2$ can be obtained with such Euler angles. In this case, the height of the component structures normalized to the wavelength $\Lambda$ may be between 6 and 10%. The metallization ratio $\eta$ can be between 0.3 and 0.7, e.g. between 0.4 and 0.6, e.g. 0.5.

In one embodiment of the electroacoustic component, the range of Euler angles is restricted here to the intervals
(50-62, 112-116, 32-40).

An electroacoustic coupling coefficient $\kappa^2$ of 0.4% and a $TCF_2 \leq 10$ ppb/$K^2$ can then be achieved.

In an alternative embodiment, the range of Euler angles is restricted to the intervals
(66-90, 122-138, 12-50).

An electroacoustic coupling coefficient $\kappa^2$ of up to 1% and the magnitude of the quadratic temperature coefficients $|TCF_2| < 50$ ppb/$K^2$ ($|TCF_2| < 50*10^{-9}/K^2$) can then be obtained.

In one embodiment, the Euler angles can be restricted to the values
(60-75, 135-155, 95).

Heights of the component structures normalized to the wavelength $\Lambda$ of 6% to 10% are then advantageous. In this case, the metallization ratio $\eta$ can again be between 0.3 and 0.7, e.g. between 0.4 and 0.6, e.g. 0.5.

In one embodiment, the Euler angles are selected from the angle ranges
(80-100, 120-170, −10-10).

A normalized height of the component structures (h/$\Lambda$) of between 6% and 10% is then possible. The metallization ratio can be chosen to be between 0.3 and 0.7, e.g. between 0.4 and 0.6, e.g. 0.5. High coupling coefficients $\kappa^2$, e.g. $\geq 0.35\%$, in conjunction with a $TCF_1 < 40$ ppm/K can thus be obtained.

In one embodiment of the electroacoustic component, the Euler angles can be selected from the angle ranges
(15-90, 95-165, 95-135),
(60-75, 135-155, 85-95),
(15-90, 95-165, 10-55).

The height of the component structures normalized to the wavelength $\Lambda$ may then be 10% or less. With the use of aluminum as the main constituent of the electrode fingers, a normalized height of between 0.5% and 15% can be chosen. With the use of copper as the main constituent of the electrode fingers, a height normalized to the wavelength $\Lambda$ of between 0.2% and 8% can be chosen.

Besides the corresponding main constituents aluminum and copper, the electrode structures can comprise even further elements and, in particular, even further layers, e.g. adhesion promoting layers comprising titanium and diffusion barriers comprising heavy elements.

In one embodiment, the angle range of the Euler angles can be restricted further by the Euler angles (15-60, 95-109, 10-18) being excluded. This is tantamount to the Euler angles being chosen from the three intervals
(]60-90, 95-165, 10-55),
(15-60, ]109-165, 10-55),
(15-90, 95-109, ]18-55).

$TCF_2 < 10$ ppb/$K^2$ in conjunction with $0.35\% \leq \kappa^2 \leq 5\%$ can thus be achieved and the coupling factor of quartz can thus be exceeded.

The electrode fingers of the electroacoustic components can have a width b. In this case, they are arranged relative to one another and spaced apart from one another such that an acoustic wave having the wavelength $\Lambda$ is capable of propagation. In this case, the distance between the finger centers is generally $\Lambda/2$. The use of split finger transducers and similar types of transducer is likewise possible; the distance between the finger centers relative to the acoustic wavelength is then correspondingly halved.

Independently of the expedient metallization ratios specified above, the metallization ratio $\eta = b/\Lambda$ of the component at least locally along the longitudinal direction of propagation X''' can be between 0.2 and 0.8. The height h of the component structures normalized to the wavelength $\Lambda$, h/$\Lambda$, can correspondingly be between 0.01% and 15%.

For the Euler angles (85°, 90°, 155°), the coupling factor $\kappa^2$ in the case of Rayleigh waves can be up to 1.32%. In the case of shear waves, the coupling factor $\kappa^2$ can attain 4%.

The acoustic wave that can be excited by electrode structures can be a Rayleigh wave and/or a horizontally and/or vertically polarized shear wave. However, the wave can also be a mixed form of these waves and, as a mixed-polarized wave, contain the individual wave modes in different excitation strengths.

The crystal structure of RE-COB has a significantly lower symmetry than quartz, for example, such that no angles known for materials having higher symmetry are suitable a priori for RE-COB. Furthermore, the low symmetry makes it more difficult to excite pure wave modes. However, the abovementioned angles enable electroacoustic components having good electrical properties despite the low symmetry.

The component can be an SAW component, a GBAW component or an LSAW component (LSAW=Leaking Surface Acoustic Wave).

In this case, the component structures can constitute conventional transducers, SPUDT transducers (SPUDT=Single-Phase Unidirectional Transducer) or NSPUDT (Natural Single-Phase Unidirectional Transducer).

Besides the piezoelectric substrate, which can be monocrystalline, and electrode layers, the component can also comprise even further layers, e.g. adhesion promoting layers, passivation layers, recesses in the substrate, e.g. as reflective elements, etc.

BRIEF DESCRIPTION OF THE DRAWINGS

The features underlying the present invention are explained in greater detail below with reference to schematic drawings.

In the figures:

FIG. 1 shows a listing sorted in accordance with the sets of Euler angles and advantageous normalized heights of the component structures and metallization ratios;

DETAILED DESCRIPTION OF ILLUSTRATIVE EMBODIMENTS

FIG. 1 shows a sorted representation of expedient Euler angles for crystal cuts or directions of propagation of acoustic waves in electroacoustic components. Expedient Euler angles are in this case substantially divided into four groups (A, B, C, D).

Group A in this case comprises the subsets A1, A2 and A3. The subset A1 for example demands a value of between 20° and 90° for the first Euler angle. The second Euler angle is between 95° and 160°. The third Euler angle is between 15° and 55°.

The subset A2, in particular, includes a sub-subset A2* having the Euler angles (30°-64°, 98°-138°, 104°-124°). In the sub-subset A2*, the electroacoustic coupling coefficient $\kappa^2$ is approximately 0.8% virtually independently of the metallization ratio.

Correspondingly, the set of Euler angles B comprises the subsets B1, B2, B3 and B4. In this case, the subset B1 comprises the further sub-subsets B1* and B1'. The sub-subset B1', in particular, enables quadratic temperature coefficients $TCF_2 < 40$ ppb/$K^2$.

The set of Euler angles C substantially consists of the subset C1, the Euler angles of which are characterized in that the third Euler angle is chosen to be between −10 and 10. The symmetry of the piezoelectric material here may be such that the third Euler angle also corresponds to an interval of between 170 and 190°.

The set D comprises the subsets $D_1$, $D_2$2 and $D_3$. The subset $D_1$ here comprises the combinations of Euler angles (15-90, 95-165, 10-55), wherein the intervals for the Euler angles ($\lambda$, $\mu$, $\theta$) (15-60, 95-109, 10-18) are excluded. The set of remaining Euler angles is thus substantially the set of Euler angles (]60-90, 95-165, 10-55)+(15-60, ]109-165, 10-55)+(15-90, 95-109, ]18-55), wherein the numerical value 60°, for the Euler angle $\lambda$ in the first case, the value of 109° in the second case and the value of 18° in the third case are theoretically excluded. However, since the number of atoms in a crystal is quantized and cutting planes intersect atoms of the crystal, the number of possible cut angles is finite, in principle, and the possible values for $\lambda$, $\mu$, $\theta$ cannot be arbitrarily close together. Whether or not the critical values 60° for $\lambda$, 109° for $\mu$ and 18° for $\theta$ are thus advantageously chosen in combination with the respectively corresponding other values of the subset $D_1$ can thus be left open.

Figure 2:
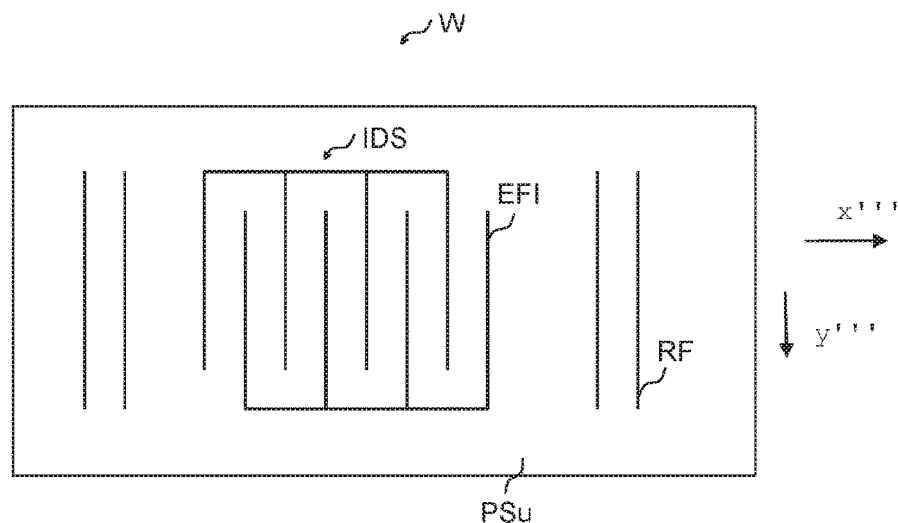
FIG. 2 shows the essential constituents of an electroacoustic transducer and the direction of propagation of the acoustic waves X'''.

FIG. 2 shows an electroacoustic transducer W comprising interdigital structures IDS flanked by reflector fingers RF. In this case, the interdigital structure IDS comprises electrode fingers EFI interconnected in each case with a busbar. An RF signal can be applied to respectively adjacent electrode fingers. Then the piezoelectric effect is utilized and an acoustic wave is excited in the piezoelectric substrate PSu. Conversely, it is also possible to convert an acoustic wave in the piezoelectric substrate PSu into an RF signal by means of the transducer structure. In this case, a component can comprise a plurality of transducers that are acoustically coupled e.g. in an acoustic track. In this case, the direction of propagation of the acoustic waves is specified by X'''. In this case, the electrode fingers EFI extend in the direction Y'''.

Figure 3:
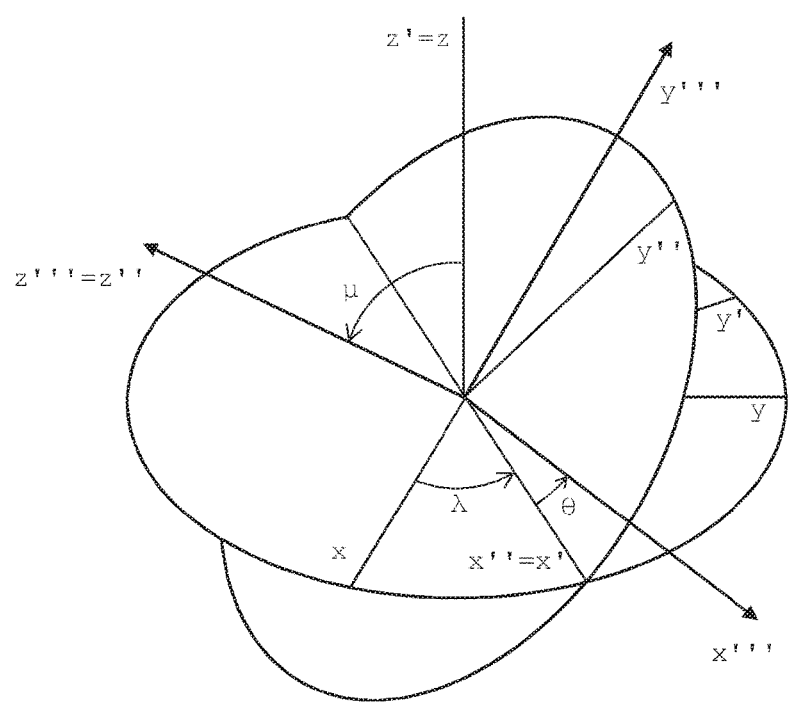
FIG. 3 shows a schematic diagram visually representing the definition used for the Euler angles.

FIG. 3 graphically shows the definition of the Euler angles. In this case, $\lambda$ denotes the first Euler angle, by which the original X-axis and the original Y-axis are rotated about the original Z-axis. A rotation about the axis x' by the angle $\mu$ subsequently follows. Finally, a rotation about the axis Z'' by the angle $\theta$ specifies how the resulting X-axis (X''') must have been rotated in order that the direction of propagation of the acoustic waves relative to the crystallographic axes, represented by the original axes x, y, z, is obtained.

Figure 4:
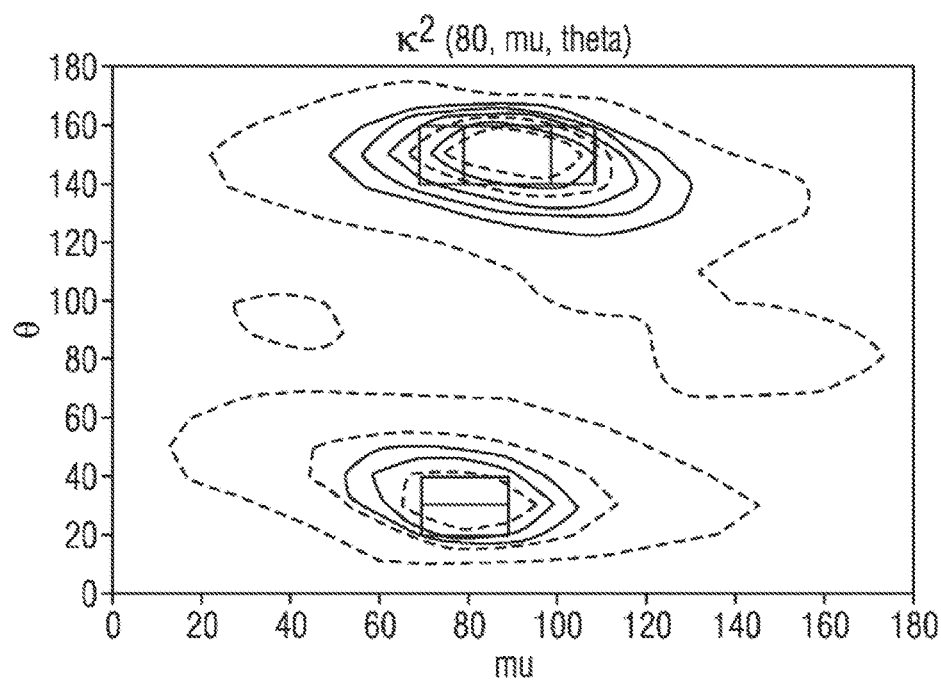
FIG. 4 shows calculated values of the electroacoustic coupling coefficient $\kappa^2$ as a function of the Euler angles $\mu$ and $\theta$.

FIG. 4 shows calculated values for the electroacoustic coupling coefficient $\kappa^2$ as a function of the Euler angles $\mu$ and $\theta$ in the case of a constant Euler angle $\lambda$ of 80° in a so-called contour plot. The values of constant coupling coefficients are identified here by dotted lines. A center around which closed contour lines pass here indicates a maximum or a minimum of the coupling coefficient.

Figure 5:
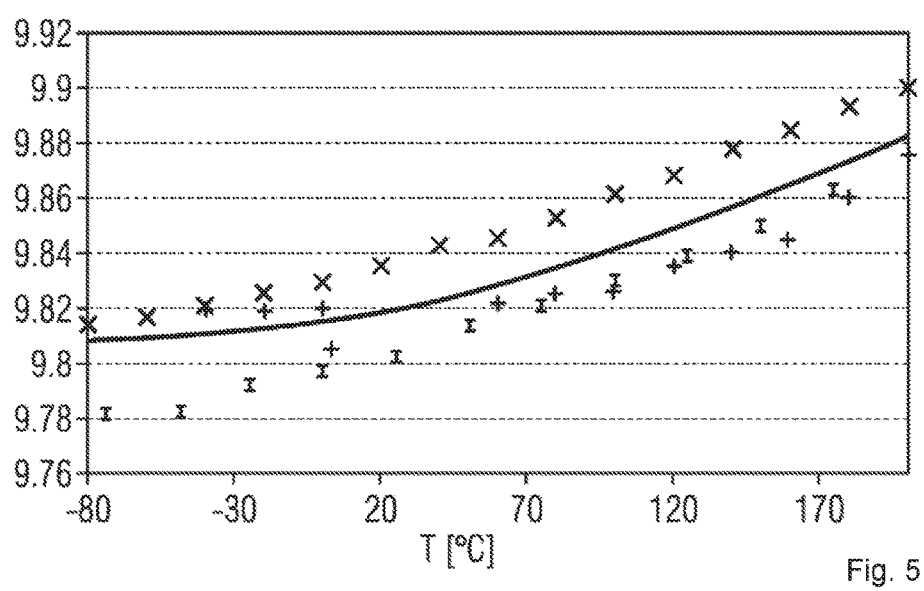
FIG. 5 shows calculated temperature dependencies.

FIG. 5 shows calculated temperature coefficients. In this case, the values approximately at −80° C. have a horizontal tangent, i.e. a vanishing gradient, such that a parabolic temperature response in a development around a temperature $T_o = -80°$ C. is obtained. For advantageous Euler angles, metallization ratios and normalized heights of the component structures, the temperature minimum of the parabola may be shifted here to significantly higher temperatures, such that a rise or a fall in temperature during the operation of a mobile communication device at customary room temperatures does not entail excessively great effects on the transmission behavior of the corresponding front-end modules.

The invention described is not restricted here to the schematic exemplary embodiments and figures. Electroacoustic components which comprise further component parts such as piezoelectric materials, layer systems in the component structures, temperature condensation layers and strain layers, compositions of the component structures, etc., are therefore likewise part of the invention.

The invention claimed is:

1. An electroacoustic component comprising:
    a piezoelectric substrate comprising a rare earth metal and calcium oxoborates (RE-COB); and
    component structures arranged on the substrate, the component structures being suitable for converting between RF signals and acoustic waves,
    wherein the acoustic waves are capable of propagation in a direction x''', and
    wherein the direction x''' is determined by Euler angles ($\lambda$, $\mu$, $\theta$), the Euler angles being selected from angle ranges (20-90, 95-160, 15-55), (20-85, 95-160, 95-125) and (15-25, 85-100, 0-175).

2. The electroacoustic component according to the preceding claim 1, wherein the direction x''' is determined by the Euler angles (30-64, 98-138, 104-124).

3. The electroacoustic component according to claim 1, wherein the piezoelectric substrate comprises neodymium (Nd)—COB or consists of Nd—COB.

4. The electroacoustic component according to claim 1, wherein the component structures comprise electrode fingers having a height h and a width b, wherein the electrode fingers are spaced apart such that an acoustic wave having a wavelength $\Lambda$ is capable of propagation, wherein a ratio h/$\Lambda$ is between 1% and 15%, wherein the electrode fingers comprise a metal, wherein a metallization ratio $\eta=b/\Lambda$ is between 0.2 and 0.8, wherein the acoustic wave is a Rayleigh wave and/or a horizontally and/or vertically polarized shear wave and/or a mixed-polarized wave.

5. An electroacoustic component comprising:
    a piezoelectric substrate comprising a rare earth metal and calcium oxoborates (RE-COB); and
    component structures arranged on the substrate, the component structures being suitable for converting between RF signals and acoustic waves,
    wherein the acoustic waves are capable of propagation in a direction x''', and
    wherein the direction x''' is determined by Euler angles ($\lambda$, $\mu$, $\theta$), the Euler angles being selected from angle ranges (15-90, 100-165, 10-50), (15-90, 100-165, 120-135), (15-30, 100-110, −10-10) and (60-75, 135-155, 93-97).

6. The electroacoustic component according to claim 5, wherein the direction x''' is determined by the Euler angles (50 . . . 62, 112 . . . 116, 32 . . . 40).

7. The electroacoustic component according to claim 6, wherein the direction x''' is determined by the Euler angles (66-90, 122-138, 12-50).

8. The electroacoustic component according to claim 7, wherein the direction x''' is determined by the Euler angles (60-75, 135-155, 95).

9. The electroacoustic component according to claim 5, wherein the component structures comprise electrode fingers having a height h and a width b, wherein the electrode fingers are spaced apart such that an acoustic wave having a wavelength $\Lambda$ is capable of propagation, wherein a ratio h/$\Lambda$ is between 1% and 15%, wherein the electrode fingers comprise a metal,
    wherein a metallization ratio $\eta=b/\Lambda$ is between 0.2 and 0.8, and wherein the acoustic wave is a Rayleigh wave and/or a horizontally and/or vertically polarized shear wave and/or a mixed-polarized wave.

10. The electroacoustic component according to claim 5, wherein the piezoelectric substrate comprises neodymium (Nd)—COB or consists of Nd—COB.

11. An electroacoustic component comprising:
    a piezoelectric substrate comprising a rare earth metal and calcium oxoborates (RE-COB); and
    component structures arranged on the substrate, the component structures being suitable for converting between RF signals and acoustic waves,
    wherein the acoustic waves are capable of propagation in a direction x''', and
    wherein the direction x''' is determined by Euler angles ($\lambda$, $\mu$, $\theta$), the Euler angles being selected from angle ranges (80-100, 120-170, −10-10).

12. The electroacoustic component according to claim 11, wherein the component structures comprise electrode fingers having a height h and a width b, wherein the electrode fingers are spaced apart such that an acoustic wave having a wavelength $\Lambda$ is capable of propagation, wherein a ratio h/$\Lambda$ is between 1% and 15%, wherein the electrode fingers comprise a metal,
    wherein a metallization ratio $\eta=b/\Lambda$ is between 0.2 and 0.8, and wherein the acoustic wave is a Rayleigh wave and/or a horizontally and/or vertically polarized shear wave and/or a mixed-polarized wave.

13. The electroacoustic component according to claim 11, wherein the piezoelectric substrate comprises neodymium (Nd)—COB or consists of Nd—COB.

14. An electroacoustic component comprising:
    a piezoelectric substrate comprising a rare earth metal and calcium oxoborates (RE-COB); and
    component structures arranged on the substrate, the component structures being suitable for converting between RF signals and acoustic waves,
    wherein the acoustic waves are capable of propagation in a direction x''', and
    wherein the direction x''' is determined by Euler angles ($\lambda$, $\mu$, $\theta$), the Euler angles being selected from angle ranges (15-90, 95-165, 95-135), (60-75, 135-155, 85-95), (15-90, 95-165, 10-55).

15. The electroacoustic component according to claim 14, wherein the directions x''' is determined by the Euler angles (15-60, 95-109, 10-18) are excluded.

16. The electroacoustic component according to claim 14, wherein the component structures comprise electrode fingers having a height h and a width b, wherein the electrode fingers are spaced apart such that an acoustic wave having a wavelength $\Lambda$ is capable of propagation, wherein a ratio h/$\Lambda$ is between 1% and 15%, wherein the electrode fingers comprise a metal, wherein a metallization ratio $\eta=b/\Lambda$ is between 0.2 and 0.8, wherein the acoustic wave is a Rayleigh wave and/or a horizontally and/or vertically polarized shear wave and/or a mixed-polarized wave.

17. The electroacoustic component according to claim 14, wherein the piezoelectric substrate comprises neodymium (Nd)—COB or consists of Nd—COB.

* * * * *